(12) United States Patent
Tominaga

(10) Patent No.: US 12,117,705 B2
(45) Date of Patent: Oct. 15, 2024

(54) LIQUID CRYSTAL DISPLAY APPARATUS CAPABLE OF REDUCING FLICKER

(71) Applicant: Sharp Display Technology Corporation, Kameyama (JP)

(72) Inventor: Masakatsu Tominaga, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 0 days.

(21) Appl. No.: 18/378,090

(22) Filed: Oct. 9, 2023

(65) Prior Publication Data
US 2024/0160067 A1    May 16, 2024

(30) Foreign Application Priority Data

Nov. 15, 2022  (JP) ................. 2022-182624

(51) Int. Cl.
| | |
|---|---|
| *G02F 1/1362* | (2006.01) |
| *G02F 1/1343* | (2006.01) |
| *G09G 3/36* | (2006.01) |
| *H01L 27/12* | (2006.01) |

(52) U.S. Cl.
CPC .... *G02F 1/13624* (2013.01); *G02F 1/134336* (2013.01); *G02F 1/134372* (2021.01); *G02F 1/136213* (2013.01); *G02F 1/136295* (2021.01); *G09G 3/3648* (2013.01); *H01L 27/124* (2013.01); *G02F 2201/121* (2013.01)

(58) Field of Classification Search
CPC .............................................. G02F 1/136213
See application file for complete search history.

(56) References Cited

U.S. PATENT DOCUMENTS

| | | | |
|---|---|---|---|
| 2010/0123842 A1* | 5/2010 | Lee ..................... | G02F 1/13624 349/39 |
| 2014/0111491 A1* | 4/2014 | Lee ..................... | G09G 3/3659 345/205 |
| 2014/0152932 A1 | 6/2014 | Miyake | |
| 2016/0048046 A1* | 2/2016 | Kim ..................... | G02F 1/13624 257/347 |
| 2016/0124276 A1* | 5/2016 | Chen .................... | G02F 1/1368 349/33 |

FOREIGN PATENT DOCUMENTS

JP          2014-130345 A          7/2014

* cited by examiner

*Primary Examiner* — Paisley L Wilson
(74) *Attorney, Agent, or Firm* — ScienBiziP, P.C.

(57) ABSTRACT

A liquid crystal display apparatus includes a TFT substrate including first and second gate bus lines, source bus lines, and pixels and a liquid crystal layer. The pixel includes a pixel electrode, a common electrode, an auxiliary electrode, and first to third TFTs. The gates of the first and second TFTs are connected to one of the first and second gate bus lines, and the drains are connected to the pixel electrode and the auxiliary electrode, respectively. The gate of the third TFT is connected to the other of the first and second gate bus lines, and the source and drain of the third TFT are connected to the pixel electrode and the auxiliary electrode, respectively. Gate signals are applied to the first and second gate bus lines so that the TFTs connected to the first and second gate bus lines are turned on at different points in time.

15 Claims, 11 Drawing Sheets

LIQUID CRYSTAL DISPLAY APPARATUS CAPABLE OF REDUCING FLICKER

BACKGROUND

1. Field

The present disclosure relates to a liquid crystal display apparatus.

2. Description of the Related Art

Liquid crystal display apparatuses are widely used in a variety of fields, and liquid crystal display apparatuses are expected to have functions that match the intended use. For example, in general, liquid crystal display apparatuses used in laptops, digital signages, smartphones, and electronic paper are expected to have low power consumption.

One way to reduce the power consumption of liquid crystal display apparatuses is to reduce the refresh rate. However, when the refresh rate is reduced, the period until next image refresh time increases, and the effect of charge leakage from a pixel increases. For example, the voltage applied to the liquid crystal may decrease and, thus, the transmittance of the pixel may vary. This may cause flicker on the display screen. Japanese Unexamined Patent Application Publication No. 2014-130345 describes a liquid crystal display apparatus that can reduce flicker at low refresh rates.

The present disclosure provides a liquid crystal display apparatus capable of reducing flicker even when the liquid crystal display apparatus is driven at a low refresh rate.

SUMMARY

According to an embodiment of the present disclosure, a liquid crystal display apparatus includes a TFT substrate including a first substrate, a plurality of gate bus lines disposed on the first substrate, where the plurality of gate bus lines each extend in a first direction and are arranged in a second direction that crosses the first direction, a plurality of source bus lines each disposed on the first substrate and extending in the second direction, and a plurality of pixels disposed on the first substrate, and a liquid crystal layer. Each of the pixels includes a pixel electrode disposed between, among the plurality of gate bus lines, a first gate bus line and a second gate bus line adjacent to each other and located facing the liquid crystal layer, a common electrode located between the first substrate and the pixel electrode so as to overlap the pixel electrode in plan view, an auxiliary electrode, a first TFT having a gate connected to one of the first gate bus line and the second gate bus line and a drain connected to the pixel electrode, a second TFT having a gate connected to the one of the first gate bus line and the second gate bus line and a drain connected to the auxiliary electrode, and a third TFT having a gate connected to the other of the first gate bus line and the second gate bus line, a source connected to one of the pixel electrode and the auxiliary electrode, and a drain connected to the other of the pixel electrode and the auxiliary electrode. Gate signals are applied to the first gate bus line and the second gate bus line so that the TFTs connected to the first gate bus line and the second gate bus line are turned on at different points in time.

DESCRIPTION OF THE EMBODIMENTS

Figure 1:
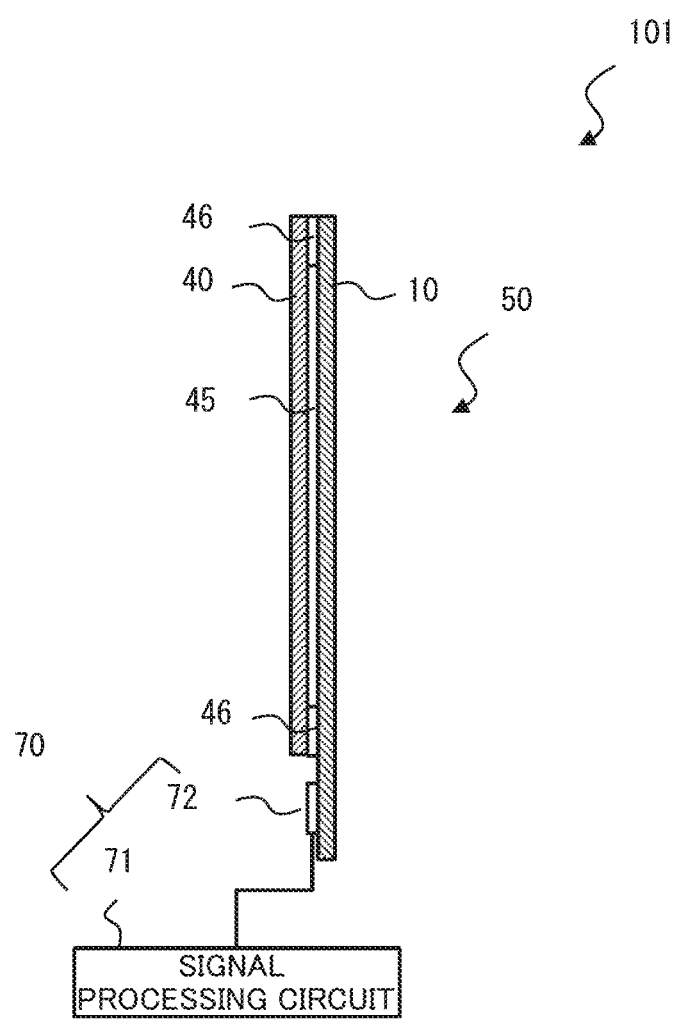
FIG. 1 is a schematic cross-sectional view of an example of the configuration of a liquid crystal display apparatus according to a first embodiment.

Embodiments of the present disclosure are described below with reference to the accompanying drawings. The present disclosure is not limited to the embodiments described below, and design changes can be made as appropriate within the scope of satisfying the configuration of the present disclosure. Furthermore, in the following description, the same reference numerals in different drawings may identify the same elements or elements having similar functions. In this case, a duplicate description of the element may be omitted. In addition, the configurations described in the embodiment and its modification may be appropriately combined or changed without departing from the scope of the present disclosure. For ease of understanding, in the drawings cited below, the configuration may be illustrated in a simplified or schematic form, or some constituent members may be omitted. The dimensional ratios between the constituent members illustrated in the drawings do not necessarily indicate the actual dimensional ratios. The term "two equal values" refers to two values when one value is in the range of 85% to 115% of the other value.

First Embodiment

FIG. 1 is a schematic illustration of a liquid crystal display apparatus 101 according to the present embodiment. The liquid crystal display apparatus 101 according to the present embodiment includes a liquid crystal panel 50 and a liquid crystal panel controller 70. The liquid crystal panel 50 includes a TFT substrate 10, a counter substrate 40, and a liquid crystal layer 45 located between the TFT substrate 10 and the counter substrate 40. The TFT substrate 10 and the counter substrate 40 are bonded together with a predetermined spacing therebetween by a seal 46, and the liquid crystal layer 45 is disposed between the TFT substrate 10 and the counter substrate 40 so as to be within a region surrounded by the seal 46.

The liquid crystal panel controller (control circuit) 70 includes a signal processing circuit 71 and a drive circuit 72.

The liquid crystal panel controller 70 receives an image signal from outside the liquid crystal display apparatus 101 and outputs a drive signal to the liquid crystal panel 50.

Figure 2:
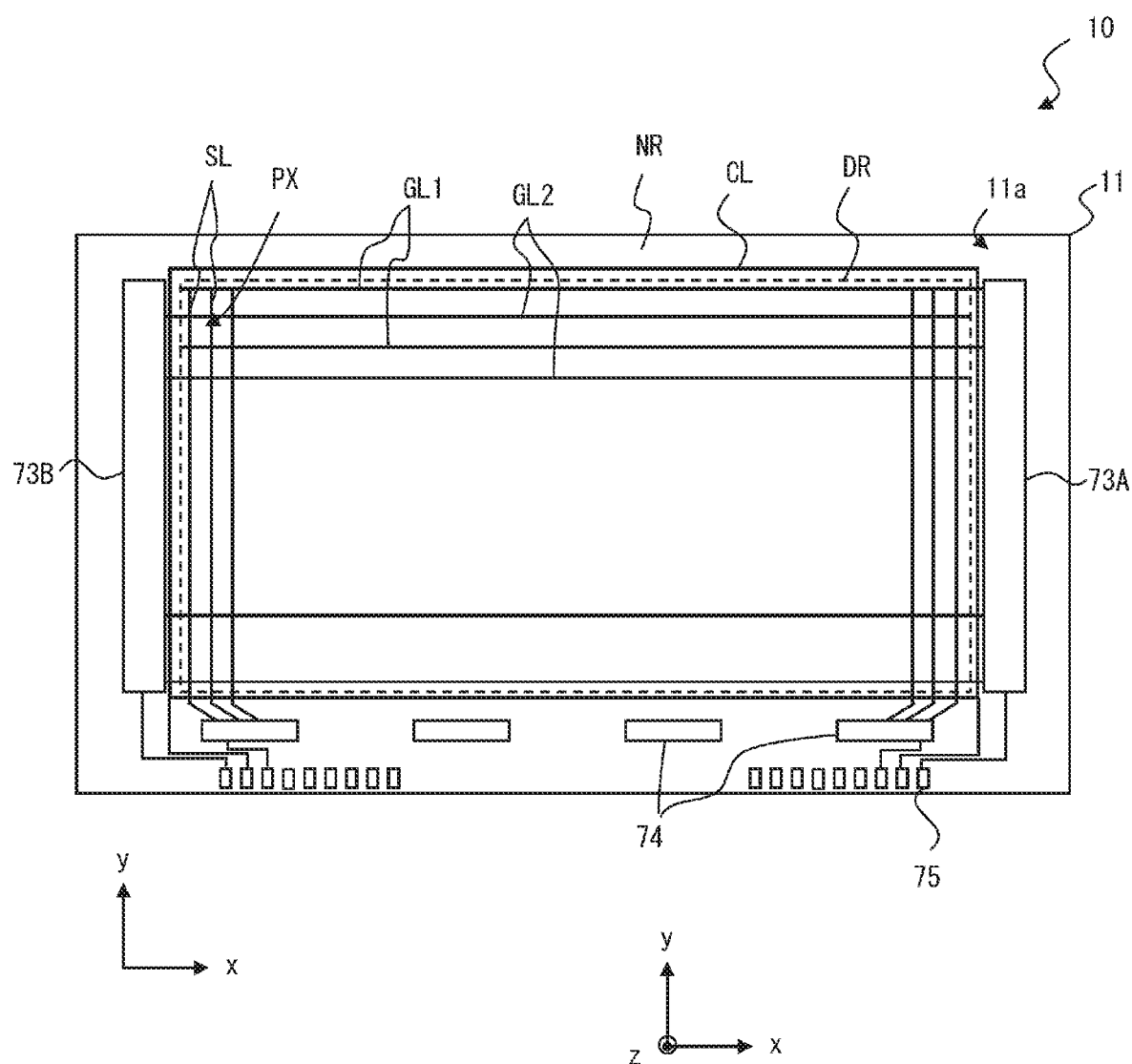
FIG. 2 is a schematic plan view of an example of the configuration of a TFT substrate of a liquid crystal display apparatus according to the first embodiment.

FIG. 2 is a schematic plan view of the configuration of the TFT substrate 10. The TFT substrate 10 includes a first substrate 11, a plurality of first gate bus lines GL1, a plurality of second gate bus lines GL2, a plurality of source bus lines SL, and a plurality of pixels PX.

The first substrate 11 has a principal surface 11a that includes a display region DR where an image is displayed and a non-display region NR that is located outside of the display region DR and does not display an image. The first substrate 11 is made of a translucent material, such as glass or resin.

The plurality of first gate bus lines GL1, the plurality of second gate bus lines GL2, the plurality of source bus lines SL, and the plurality of pixels are disposed in the display region DR of a first principal surface. More specifically, in the display region DR, the plurality of first gate bus lines GL1 and the plurality of second gate bus lines GL2 extend in a direction parallel to the x-axis, which is a first direction, and are arranged alternately one by one in a direction parallel to the y-axis, which is a second direction that crosses the first direction. The plurality of source bus lines SL extend in a direction parallel to the y-axis and are arranged in the direction parallel to the x-axis. As described in more detail below, the major constituent elements of each of the pixels PX are arranged in a region surrounded by the first and second gate bus lines GL1 and GL2 adjacent to each other in the y-axis direction and a pair of source bus lines SL adjacent to each other in the x-axis direction. The plurality of pixels PX are arranged in the display region DR in two dimensional space represented by the x-axis and y-axis directions.

One end of each of the first gate bus line GL1, the second gate bus line GL2, and the source bus line SL extends to the non-display region NR and is connected to the drive circuit 72 located in the non-display region NR. According to the present embodiment, the drive circuit 72 includes a first gate driver 73A, a second gate driver 73B, and a source driver 74.

The first gate driver 73A and the second gate driver 73B are disposed so as to sandwich the first gate bus lines GL1 and the second gate bus lines GL2 in the x-axis direction. According to the present embodiment, the first gate driver 73A is connected to the first gate bus lines GL1, and the second gate driver 73B is connected to the second gate bus lines GL2.

As described in detail below, when the liquid crystal display apparatus 101 is driven at a low refresh rate, the drive circuit 72 drives the pixels PX using an interlaced technique. For example, the first gate driver 73A drives the first gate bus lines GL1 in even-numbered fields, and the second gate driver 73B drives the second gate bus lines GL2 in odd-numbered fields. This configuration simplifies the layout of the drive circuit 72 and the connections of the drive circuit 72 with the first gate bus lines GL1, the second gate bus lines GL2, and the source bus lines SL.

However, for example, the gate driver may not be divided, and a single gate driver may be disposed at one end of each of the first gate bus lines GL1 and the second gate bus lines GL2. In this case, the gate driver may be configured to be driven using an interlaced technique. The first gate driver 73A and the second gate driver 73B are integrally configured by, for example, TFTs disposed on the first substrate 11. Each of the first gate driver 73A and the second gate driver 73B may be configured as a bare chip or a packaged chip and be mounted in a frame region of the first substrate 11. Alternatively, at least some of the circuit elements that constitute the first gate driver 73A and the second gate driver 73B may be disposed within the display region DR in a distributed manner.

The source driver 74 is disposed at one end of each of the plurality of source bus lines SL and is connected to the plurality of source bus lines SL. The source driver 74 is composed of, for example, bare chips and is mounted on the first substrate 11. The source driver 74 may be composed of packaged chips or may be integrally configured by TFTs disposed on the first substrate 11.

The first substrate 11 further has, disposed thereon, a common line CL connected to the common electrode. The common line CL is disposed to surround the display region DR. Furthermore, the first substrate 11 has external connection terminals 75 disposed thereon. The first gate bus lines GL1, the second gate bus lines GL2, the source bus lines SL, and the common line CL are connected to the external connection terminals 75. The external connection terminals 75 are connected to the signal processing circuit 71 by wiring, such as a flexible printed circuit board.

Figure 3:
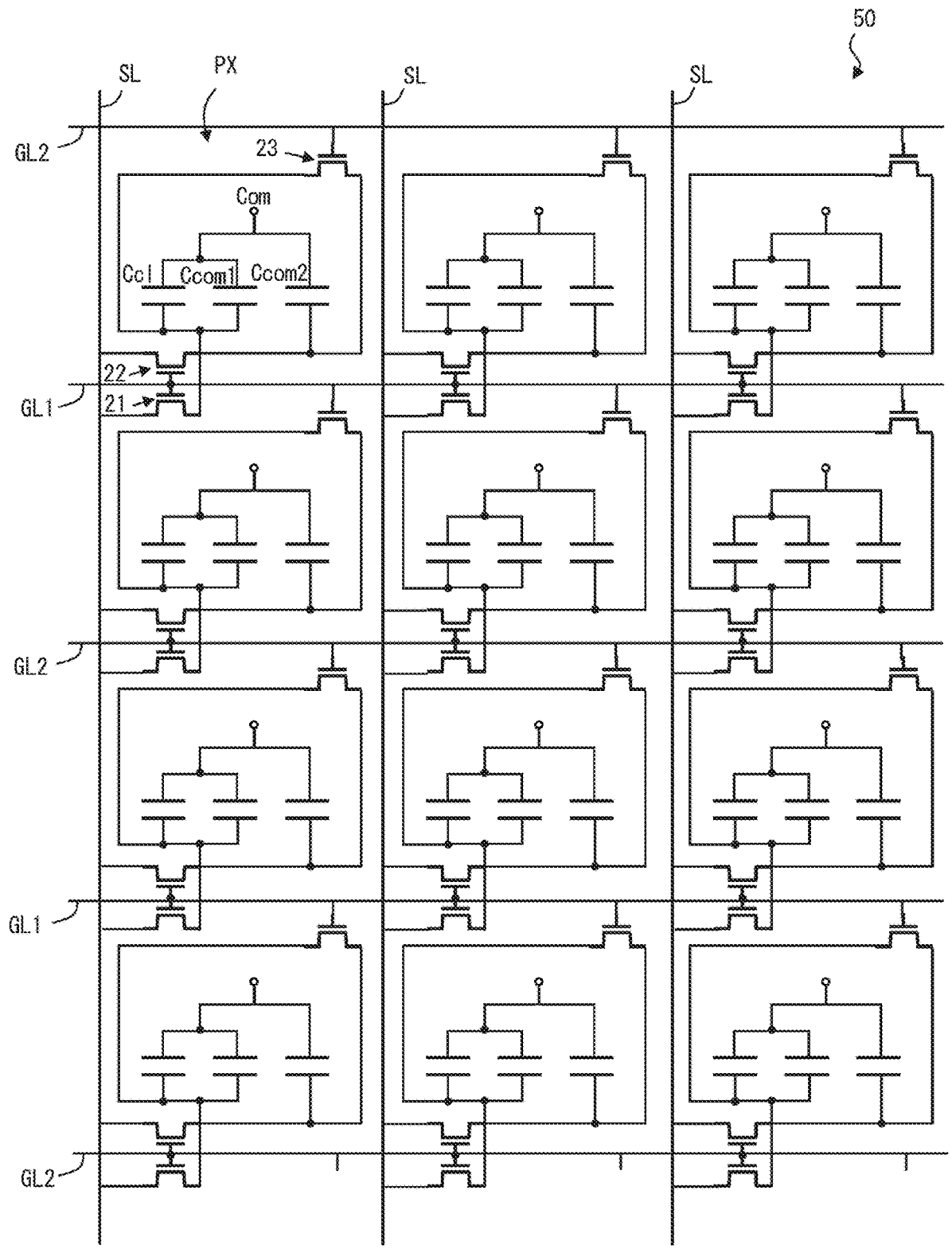
FIG. 3 is an equivalent circuit diagram of a liquid crystal panel of the liquid crystal display apparatus according to the first embodiment.
Figure 4:
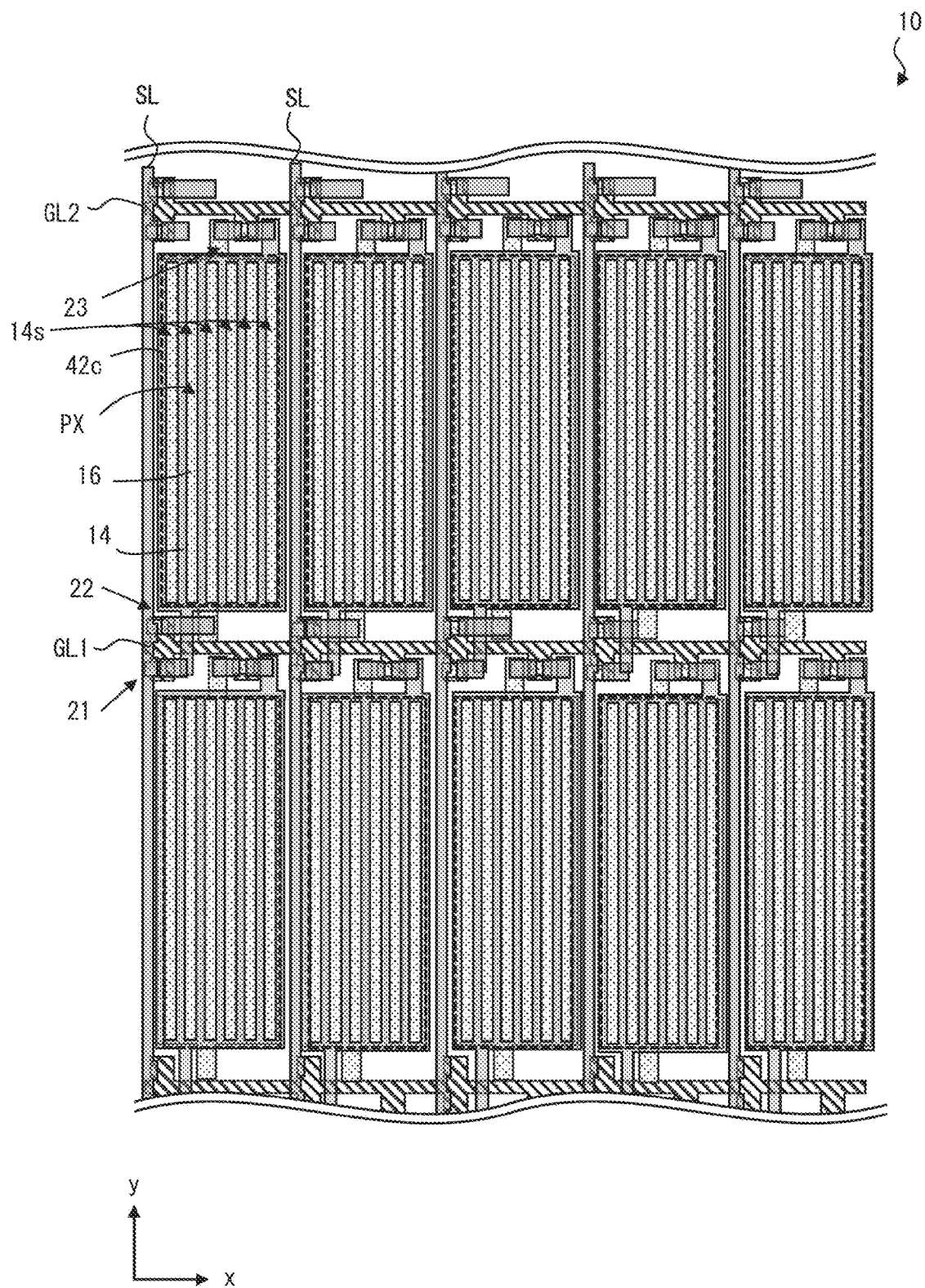
FIG. 4 is a plan view of the TFT substrate illustrated in FIG. 2.
Figure 5:
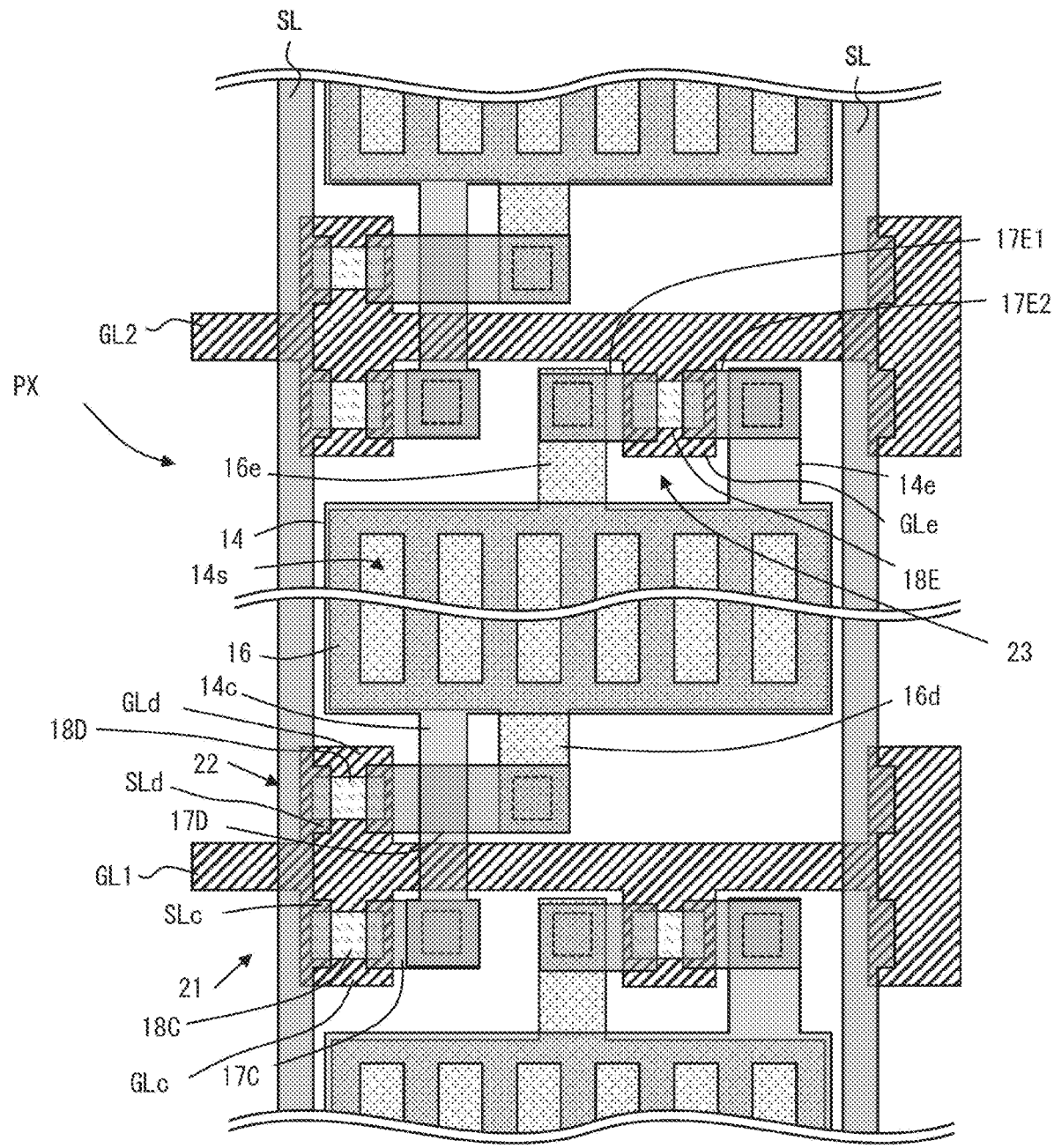
FIG. 5 is an enlarged plan view of one pixel of the TFT substrate illustrated in FIG. 4.
Figure 6:
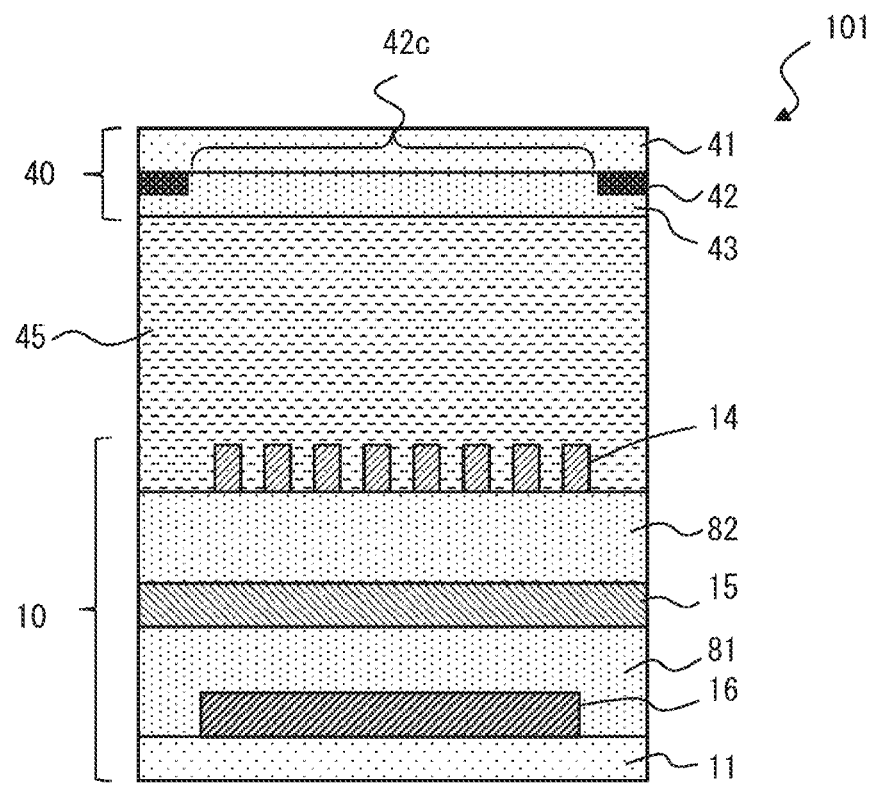
FIG. 6 is a cross-sectional view of the liquid crystal panel at the center and its vicinity of one pixel.

The structure of the pixel PX is described in detail below. FIG. 3 is an equivalent circuit diagram of the liquid crystal panel 50, and FIG. 4 is a plan view of the TFT substrate 10. FIG. 5 is an enlarged plan view of one of the pixels PX of the TFT substrate 10. FIG. 6 is a cross-sectional view of the liquid crystal panel 50 at the center and its vicinity of one pixel. In FIGS. 4 and 5, the insulating layer and some constituent elements are not illustrated. In FIG. 5, the center portion of the pixel and its vicinity are not illustrated.

The pixel PX includes a first TFT 21, a second TFT 22, a third TFT 23, a pixel electrode 14, a common electrode 15, and an auxiliary electrode 16. The pixel PX further includes a first insulating layer 81 and a second insulating layer 82. These constituent elements are supported by the first substrate 11. According to the present embodiment, the liquid crystal panel 50 uses the FFS (Fringe Field Switching) technique to orient the liquid crystal layer 45.

The pixel electrode 14 is disposed between a pair of mutually adjacent first gate bus line GL1 and second gate bus line GL2 and is located facing the liquid crystal layer 45. The pixel electrode 14 has, for example, a plurality of slit-like openings 14s each extending in the y-axis direction and arranged in the x-axis direction. The pixel electrode 14 is made of a transparent conductive material, such as ITO.

The common electrode 15 does not face the liquid crystal layer 45 and is located between the first substrate 11 and the pixel electrode 14. The second insulating layer 82 is located between the common electrode 15 and the pixel electrode 14 to electrically insulate the common electrode 15 from the pixel electrode 14. The common electrode 15 of each of the pixels is connected to the common electrode 15 of the adjacent pixel PX and integrally forms a single electrode. The common electrode 15 is made of a transparent conductive material, such as ITO.

According to the present embodiment, the auxiliary electrode 16 is located between the common electrode 15 and the first substrate 11. The first insulating layer 81 is located between the common electrode 15 and the auxiliary electrode 16. The auxiliary electrode 16 is located on the first substrate 11. The auxiliary electrode 16 is made of a transparent conductive material, such as ITO.

As illustrated in FIG. 3 and FIG. 6, a capacitor Ccl consists of a pair consisting of the pixel electrode 14 and the common electrode 15 and the liquid crystal layer 45, and a capacitor Ccom1 consists of a pair consisting of the pixel electrode 14 and the common electrode 15, the second insulating layer 82, and the like. In addition, a capacitor Ccom2 consists of a pair consisting of the common electrode 15 and the auxiliary electrode 16, the first insulating layer 81, and the like.

The liquid crystal display apparatus 101 according to the present embodiment charges the capacitors Ccl and Ccom1 by applying a voltage between the pixel electrode 14 and the common electrode 15 and controls the orientation of the liquid crystal in the liquid crystal layer 45 by the electric field generated by the charged capacitors. In addition, the liquid crystal display apparatus 101 applies a voltage between the auxiliary electrode 16 and the common electrode 15 to store charge in the capacitor Ccom2. When a charging period of the capacitors Ccl and Ccom1 ends, the charge gradually leaks from the liquid crystal layer 45, which is the capacitor Ccl, and the voltage applied to the liquid crystal layer 45 decreases. Therefore, before an image is refreshed, the charge stored in the capacitor Ccom2 is transferred to the capacitors Ccl and Ccom1, thus compensating for the reduced charge and increasing the decreased voltage again. To perform the operation, each of the pixels PX includes the first TFT 21, the second TFT 22, and the third TFT 23.

The first TFT 21 and the second TFT 22 are connected to one of the pair of a first gate bus line GL1 and a second gate bus line GL2 that sandwich the pixel electrode 14 and apply voltage to the pixel electrode 14 and the auxiliary electrode 16 on the basis of a gate signal applied to the one of gate bus lines to which the first TFT 21 and the second TFT 22 are connected. For example, in the first TFT 21, the gate is connected to the first gate bus line GL1 and the drain is connected to the pixel electrode 14. In the second TFT 22, the gate is connected to the first gate bus line GL1, and the drain is connected to the auxiliary electrode 16.

The third TFT 23 connects the pixel electrode 14 to the auxiliary electrode 16 at different point in time from the first TFT 21 and the second TFT 22. Therefore, the third TFT 23 is connected to the other of the pair of a first gate bus line GL1 and a second gate bus line GL2 that sandwich the pixel electrode 14 and electrically connects the pixel electrode 14 to the auxiliary electrode 16 on the basis of a gate signal applied to the other gate bus line G to which the third TFT 23 is connected. The gate signals are applied to the first gate bus line GL1 and the second gate bus line GL2 at different points in time. For example, in the third TFT 23, the gate is connected to the second gate bus line GL2, the source is connected to one of the pixel electrode 14 and the auxiliary electrode 16, and the drain is connected to the other of the pixel electrode 14 and the auxiliary electrode 16.

To drive the pixels PX using the interlaced technique, in the pixel PX adjacent to the above-described pixel in the y-axis direction, the gates of the first TFT 21 and the second TFT 22 are connected to the second gate bus line GL2, and the gate of the third TFT 23 is connected to the first gate bus line GL1. That is, pairs of the first TFT 21 and the second TFT 22 of the pixels PX arranged in the y-axis direction are alternately connected to one of the first gate bus lines GL1 and one of the second gate bus lines GL2.

For example, as illustrated in FIG. 5, the first TFT 21 includes a first gate electrode portion GLc led out from the first gate bus line GL1 in the y-axis direction and a semiconductor layer 18C disposed on the first gate electrode portion GLc. One end of the semiconductor layer 18C overlaps a source electrode portion SLc led out from the source bus line SL in the x-axis direction and is ohmic-connected. The other end of the semiconductor layer 18C is ohmic-connected to a drain electrode 17C. The drain electrode 17C overlaps a connection portion 14c led out from the pixel electrode 14 in the y-axis direction and is electrically connected via a contact hole.

The second TFT 22 includes a second gate electrode portion GLd led out from the first gate bus line GL1 in the y-axis direction and a semiconductor layer 18D disposed on the second gate electrode portion GLd. In the configuration illustrated in FIG. 5, the second gate electrode portion GLd is located on the opposite side of the first gate bus line GL1 from the first gate electrode portion GLc in the y-axis direction. One end of the semiconductor layer 18D overlaps a source electrode portion SLd extending from the source bus line SL in the x-axis direction and is ohmic-connected. The other end of the semiconductor layer 18D is ohmic-connected to the drain electrode 17D. The drain electrode 17D overlaps a connection portion 16d led out from the auxiliary electrode 16 in the y-axis direction and is electrically connected via a contact hole. The first TFT 21 and the second TFT 22 are connected in parallel to the source bus line SL.

The third TFT 23 includes a third gate electrode portion GLe led out from the second gate bus line GL2 in the y-axis direction and a semiconductor layer 18E disposed on the third gate electrode portion GLe. One end of the semiconductor layer 18E overlaps a source electrode 17E1 and is ohmic-connected. The other end of the semiconductor layer 18E is ohmic-connected to a drain electrode 17E2. The source electrode 17E1 overlaps a connection portion 16e led out from the auxiliary electrode 16 in the y-axis direction and is electrically connected via a contact hole. The drain electrode 17E2 overlaps a connection portion 14e led out from the pixel electrode 14 in the y-axis direction and is electrically connected via a contact hole.

As described above, in a pixel PX adjacent to the pixel in the y-axis direction, the gates of the first TFT 21 and second TFT 22 are connected to the second gate bus line GL2, and the gate of the third TFT 23 is connected to the first gate bus line GL1.

It is desirable that the transistor characteristics of the first TFT 21 and second TFT 22 be the same. More specifically, it is desirable that the sizes, the shapes, and the like of the first TFT 21 and the second TFT 22 be the same. In addition, it is desirable that the capacitance of the capacitor (Ccl+Ccom1) formed by the pixel electrode 14 and the common electrode 15 be the same as that of the capacitor (Ccom2) formed by the auxiliary electrode 16 and the common electrode 15. This configuration allows the values of a feedthrough voltage (described below) to be the same regardless of whether the source signal is positive or negative and, thus, the positive and negative write voltages for a voltage Vcom applied to the common electrode 15 can be the same. The transistor characteristics of the third TFT 23 may differ from the transistor characteristics of the first TFT 21 and the second TFT 22.

It is desirable that when the semiconductor layers 18C, 18D, and 18E constitute a TFT, the leakage current be small in the case of "OFF". For example, it is desirable that the semiconductor layers 18C, 18D, and 18E be made of an oxide semiconductor material containing at least one metallic element among In, Ga, and Zn. For example, the semiconductor layers 18C, 18D, and 18E may be made of an In—Ga—Zn—O semiconductor, an In—Sn—Zn—O semiconductor, or the like. Alternatively, the oxide semiconductor material may be an amorphous oxide semiconductor or a crystalline oxide semiconductor having a crystalline portion. The drain electrode 17C, the drain electrode 17D, the source electrode 17E1, and the drain electrode 17E2 are made of, for example, a metal or a semiconductor layer in which impurities are doped at a high concentration.

Figure 7:
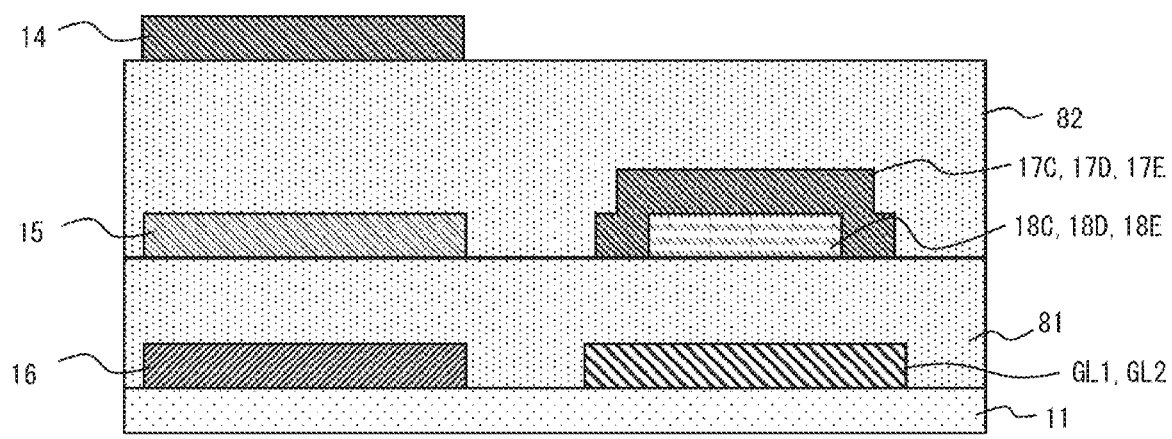
FIG. 7 is a schematic illustration of the positions in the height direction of the constituent elements of the TFT substrate illustrated in FIG. 4.

FIG. 7 is a schematic illustration of the positions of the pixel electrode 14, the common electrode 15, and the auxiliary electrode 16 in the height direction above or on the first substrate 11 of the TFT substrate 10. For example, like the first gate bus line GL1, the second gate bus line GL2, the first gate electrode portion GLc, the second gate electrode portion GLd, and the third gate electrode portion GLe, the auxiliary electrode 16 can be disposed below the first insulating layer 81 including the gate insulating layer. The common electrode 15 can be disposed between the first insulating layer 81 and the second insulating layer 82. The pixel electrode 14 is disposed on the second insulating layer 82.

The auxiliary electrode 16 is located closer to the first substrate 11 than the common electrode 15 and is not in contact with the liquid crystal layer 45. Therefore, the auxiliary electrode 16 is not a pixel electrode that directly generates an electric field in the liquid crystal layer 45.

As illustrated in FIG. 6, the counter substrate 40 includes a second substrate 41, a black matrix 42, and an overcoat layer 43. The second substrate 41 is made of a transparent material, such as glass or resin.

The black matrix 42 is located on the second substrate 41 and has a plurality of openings 42c. In plan view, the plurality of openings 42c define a region of the plurality of pixels PX that transmits light. In plan view, the black matrix 42 covers the first gate bus line GL1, the second gate bus line GL2, the source bus line SL, the first TFT 21, the second TFT 22, and the third TFT 23.

In plan view, the opening 42c overlaps at least part of the pixel electrode 14, at least part of the common electrode 15, and at least part of the auxiliary electrode 16. According to the present embodiment, the pixel electrode 14 is located within the entirety of the opening 42c in plan view. The pixel electrode 14, the common electrode 15, and the auxiliary electrode 16 are all made of a transparent conductive material and, thus, the capacitance of the capacitor Ccom2 formed by the auxiliary electrode 16 can be increased without reducing the area of a region that substantially contributes to displaying.

Although not illustrated in FIG. 5 and the like, a color filter is provided on the counter substrate 40. In addition, alignment films are disposed on the surfaces of the TFT substrate 10 and the counter substrate 40 each in contact with the liquid crystal layer 45.

Figure 8:
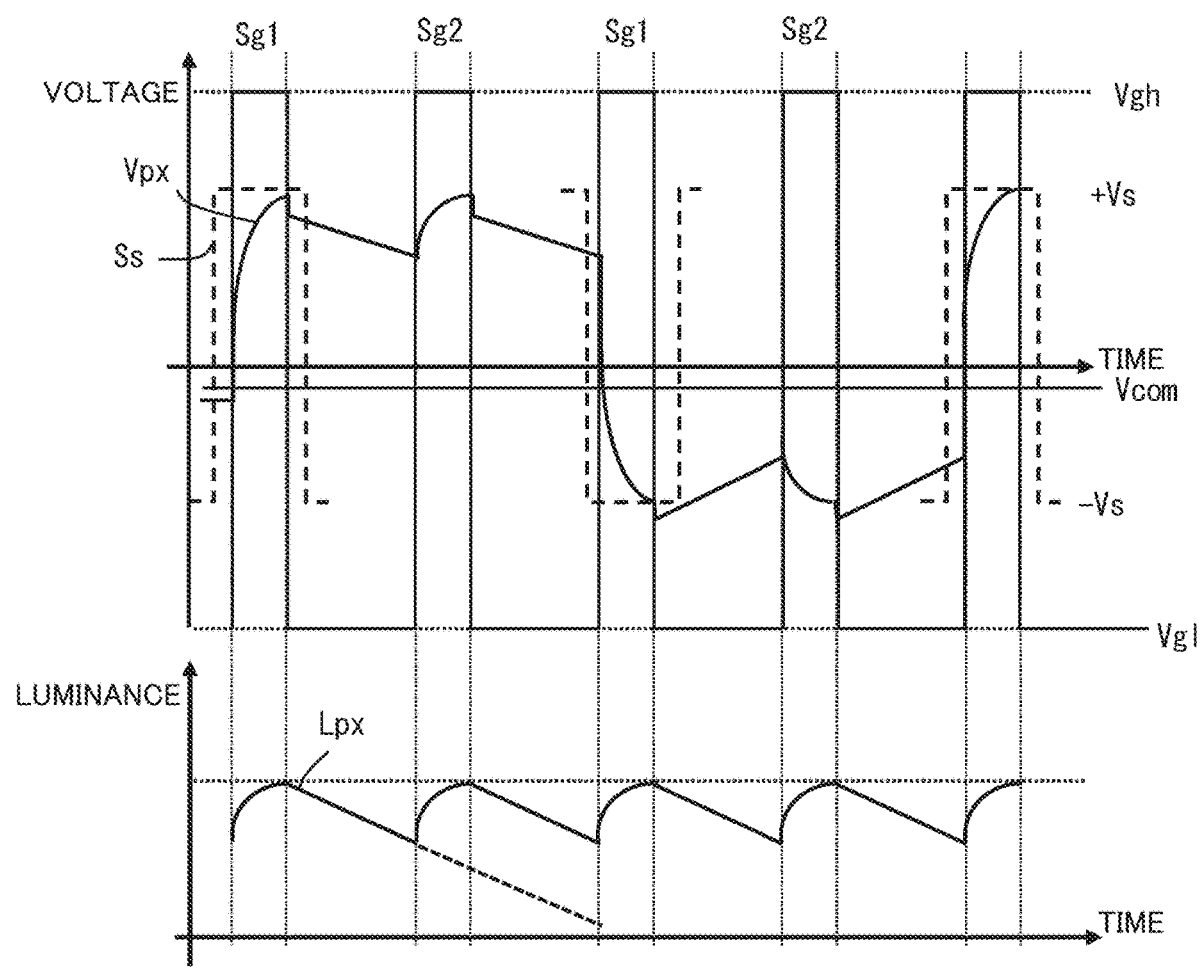
FIG. 8 is a timing diagram of signals applied to the TFT substrate illustrated in FIG. 4 and the pixel luminance.

The operation performed by the liquid crystal display apparatus 101 is described below. FIG. 8 is a timing diagram of signals applied to the TFT substrate 10 and the pixel luminance. In FIG. 8, Sg1 represents the period during which the gate signal applied to the first gate bus line GL1 is at high level (Vgh), and Sg2 represents the period when the gate signal applied to the second gate bus line GL2 is at high level (Vgh).

The gate signals are applied to the first gate bus line GL1 and the second gate bus line GL2 at different points in time to turn on TFTs connected to the first gate bus line GL1 and the second gate bus line GL2, respectively. When the gate signal applied to the first gate bus line GL1 is at high level (Vgh) in the even-numbered field period Sg1, the first TFT 21 and the second TFT 22 are turned on, a voltage corresponding to the amplitude of the source signal Ss applied to the source bus line SL is applied to the pixel electrode 14 and the auxiliary electrode 16, and the capacitors Ccl, Ccom1, and Ccom2 are charged. As a result, a voltage Vpx of the pixel electrode abruptly increases and saturates. In addition, a pixel luminance Lpx increases.

When the gate signal changes from high level (Vgh) to low level (Vgl), the first TFT 21 and second TFT 22 are turned off. At this time, the voltage Vpx of the pixel electrode decreases (a feed-through voltage). Subsequently, the charge charged in the capacitor Ccl decreases due to charge leakage from the liquid crystal layer 45. As a result, the charge in the capacitor Ccom1 also decreases. In addition, the voltage Vpx of the pixel electrode 14 gradually decreases. The pixel luminance Lpx also gradually decreases. In contrast, the capacitor Ccom2 formed by the auxiliary electrode 16 is not connected in parallel to the capacitors Ccl and Ccom1 and is independent. For this reason, the charge in the capacitor Ccom2 is maintained.

Subsequently, in the odd-numbered field period Sg2, the gate signal applied to the second gate bus line GL2 is at high level (Vgh), and the third TFT 23 is turned on. As a result, the auxiliary electrode 16 and the pixel electrode 14 are electrically connected. Since the charge in the capacitor Ccom2 formed by the auxiliary electrode 16 is maintained, the potential of the auxiliary electrode 16 is also maintained at a higher level than that of the pixel electrode 14. For this reason, the charge is transferred from the capacitor Ccom2 to the capacitors Ccl and Ccom1.

The capacitors Ccl and Ccom1 are charged again, and the voltage Vpx of the pixel electrode 14 increases again and saturates. As a result, the pixel luminance Lpx also increases again. Since the voltages applied to the pixel electrode 14 and the auxiliary electrode 16 in even-numbered fields are the same, the voltage Vp of the pixel electrode 14 does not exceed the highest voltage at the time of charging in even-numbered fields.

When the gate signal changes from high level (Vgh) to low level (Vgl), the third TFT 23 is turned off, and the voltage Vpx of the pixel electrode 14 decreases (a feed-through voltage). Thereafter, the charge leaks from the liquid crystal layer 45 again, causing the charge in capacitors Ccl and Ccom1 to decrease and the voltage Vpx of the pixel electrode to gradually decrease. The pixel luminance Lpx also decreases gradually. However, since the luminance has been increased by recharging, the decrease in luminance is reduced, as compared with the case without recharging (a dashed line).

In a pixel adjacent to the pixel in the y-axis direction, the gates of the first TFT 21 and the second TFT 22 are connected to the second gate bus line GL2. Therefore, in odd-numbered field periods Sg2, the gate signal applied to the second gate bus line GL2 is at high level (Vgh), and the first TFT 21 and second TFT 22 are turned on. In addition, in even-numbered field periods Sg1, the gate signal applied to the first gate bus line GL1 is at high level (Vgh), and the third TFT 23 is turned on.

As described above, the operation for one frame is completed. In the next frame, the sign of the source signal amplitude is reversed, and a similar operation is performed. To reduce power consumption of the liquid crystal display apparatus 101, it is desirable that the refresh rate be 20 Hz or lower, and it is more desirable that the refresh rate be 10 Hz or lower.

Thus, according to the liquid crystal display apparatus 101 of the present embodiment, even when the refresh rate is reduced to increase the image refresh interval (one frame period), the charge that leaks from the liquid crystal layer 45 in each pixel PX can be compensated for by the charge stored in the auxiliary electrode 16 during the period until the next image refresh time. As a result, the voltage drop of the pixel electrode 14 can be reduced, and flicker can be reduced.

Since the first TFT 21 and the second TFT 22 are connected in parallel, the influence of the internal resistance of the TFTs can be reduced, and the pixel electrode 14 and the auxiliary electrode 16 can be charged at the same voltage.

The common electrode 15 for applying voltage to the liquid crystal layer 45 is used as a counter electrode for the auxiliary electrode 16, and the auxiliary electrode 16 is disposed on the opposite side of the common electrode 15 from the pixel electrode 14. For this reason, the area of the auxiliary electrode 16 can be increased without being limited by the pixel electrode 14, and the capacitance of the capacitor Ccom2 formed by the auxiliary electrode 16 can be increased, that is, the amount of charge for compensating for the leaked charge can be increased. In addition, by making the auxiliary electrode 16 using a transparent conductive material, the aperture ratio of the pixel is not reduced.

Since the pixel electrode 14 has a plurality of slit-like openings to orient the liquid crystal in the liquid crystal layer using an FFS technique, the common electrode 15 can be disposed in the TFT substrate 10, thus facilitating the use of the common electrode 15 as the counter electrode for the auxiliary electrode, as described above.

Second Embodiment

Figure 9:
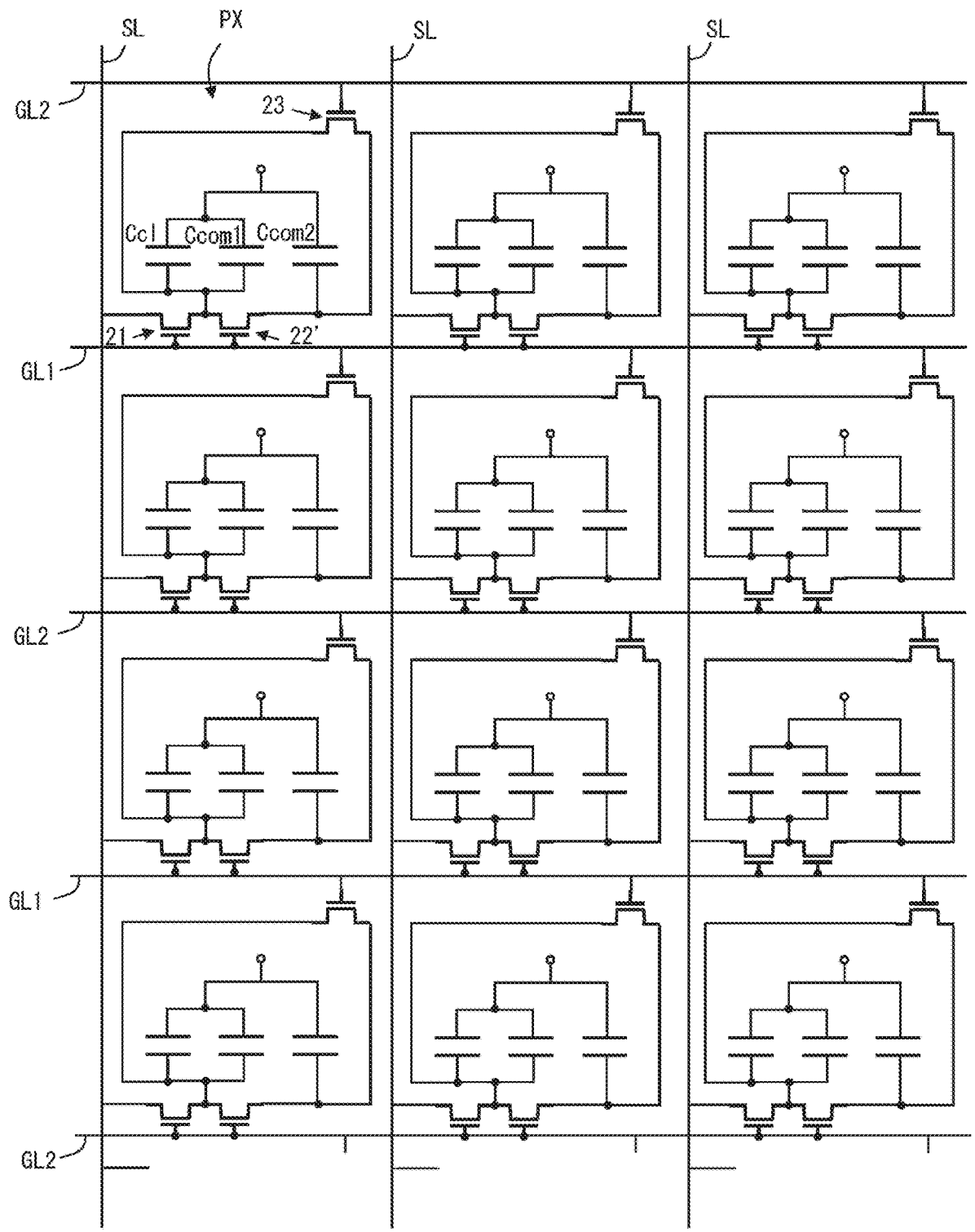
FIG. 9 is an equivalent circuit diagram of a liquid crystal panel of a liquid crystal display apparatus according to a second embodiment.
Figure 10:
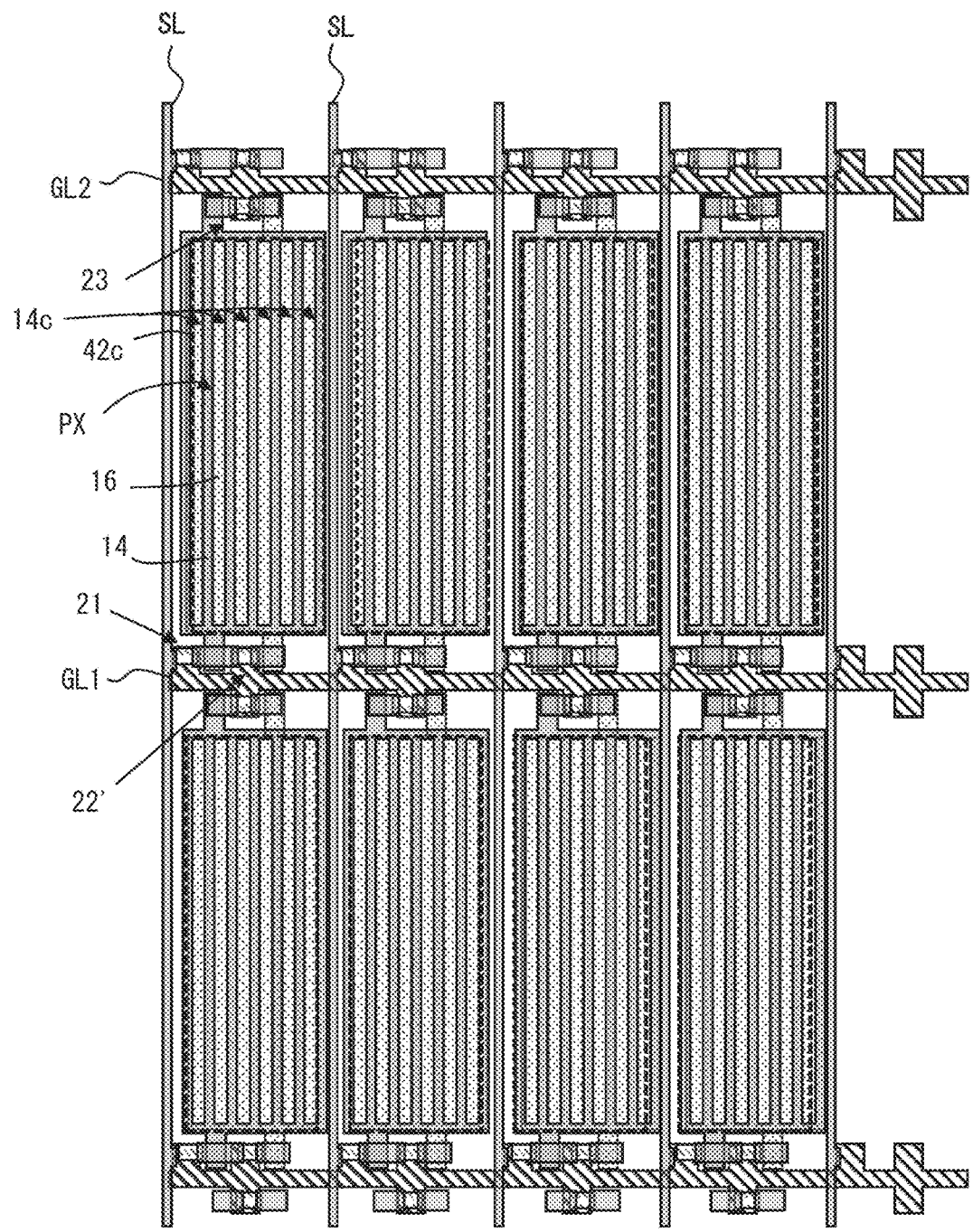
FIG. 10 is a plan view of the TFT substrate illustrated in FIG. 9.
Figure 11:
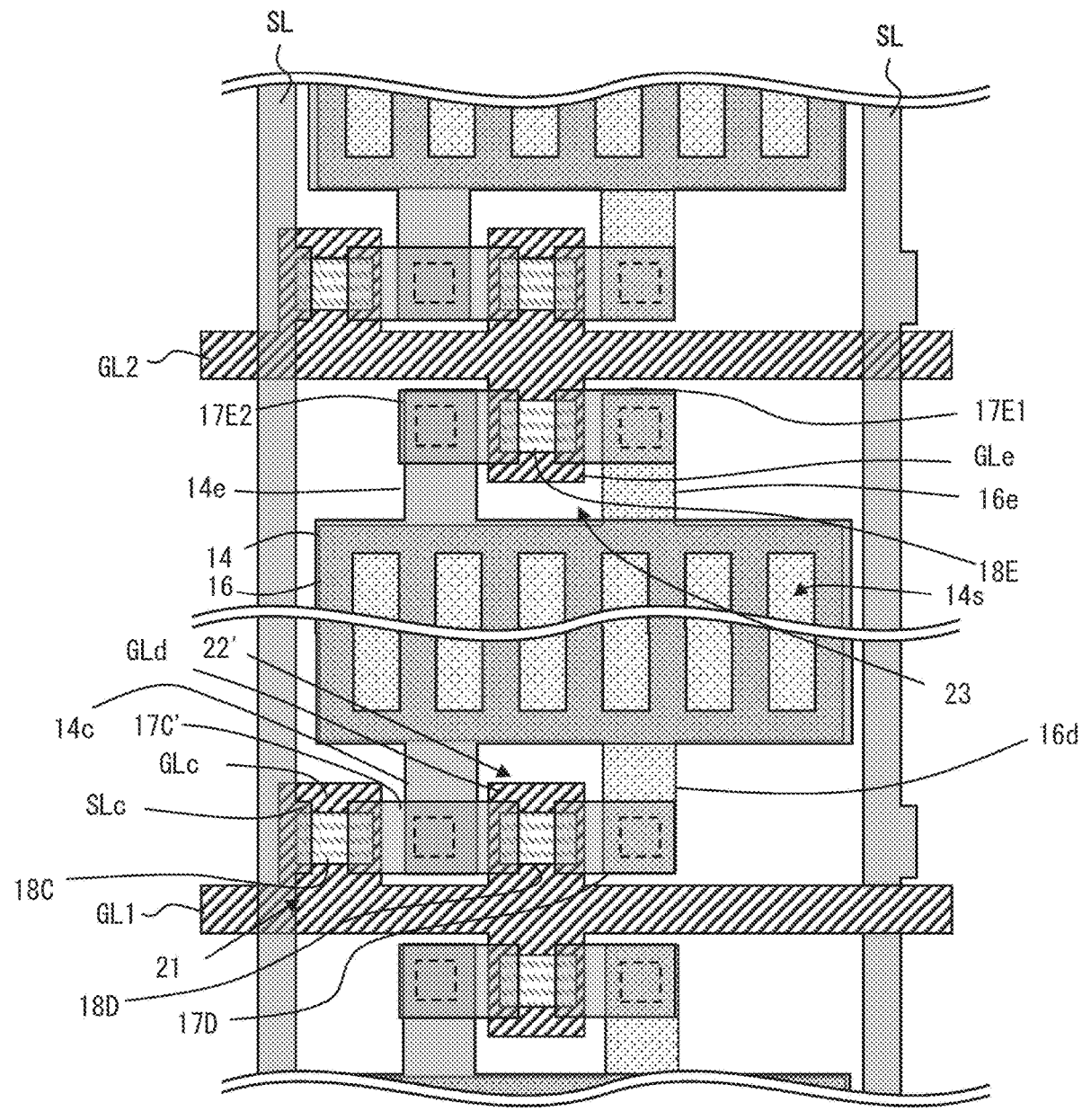
FIG. 11 is an enlarged plan view of one pixel of the TFT substrate illustrated in FIG. 9.

FIG. 9 is an equivalent circuit diagram of a liquid crystal panel 50' of a liquid crystal display apparatus according to the present embodiment, and FIG. 10 is a plan view of a TFT substrate 10'. FIG. 11 is an enlarged plan view of a pixel PX of the TFT substrate 10'.

Unlike the liquid crystal display apparatus 101 according to the first embodiment, in the liquid crystal display apparatus according to the present embodiment, the source of a second TFT 22' is connected to the drain of the first TFT 21 instead of being connected to a source bus line SL. That is, the first TFT 21 and the second TFT 22' are connected in series.

As illustrated in FIG. 11, a first gate electrode portion GLc and a second gate electrode portion GLd are located on the same side of the first gate bus line GL1 in the y-axis direction. The connection portion 14c of the pixel electrode 14 is located between the first gate electrode portion GLc and the second gate electrode portion GLd in plan view. A conductive layer 17C' is ohmic-connected to the semiconductor layer 18C and the semiconductor layer 18D and is electrically connected to the connection portion 14c through a contact hole.

Like the liquid crystal display apparatus 101 according to the first embodiment, in the liquid crystal display apparatus according to the present embodiment, by driving the first gate bus lines GL1 and the second gate bus lines GL2 using the interlaced technique, charge leaked from the liquid crystal layer 45 in each pixel PX can be compensated for by the charge stored by the auxiliary electrode 16 during one frame period, as in the first embodiment. As a result, the voltage drop of the pixel electrode 14 can be reduced, and flicker can be reduced. In particular, according to the present embodiment, the source of the second TFT 22' is connected to the drain of the first TFT 21 connected to the pixel electrode 14 instead of being connected to the source bus line SL which has a large potential fluctuation. For this reason, the potential difference between the source and drain decreases when the second TFT 22' is turned off, and the charge stored in the capacitor Ccom2 is less likely to leak.

The series connection of the first TFT 21 and the second TFT 22' increases the transistor resistance between the source bus line SL and the auxiliary electrode 16 and, thus, when the first TFT 21 and the second TFT 22' are ON, the capacitor Ccom2 may not be charged sufficiently. In this case, the semiconductor layer 18C and the semiconductor layer 18D may be made of a material with high mobility, such as low-temperature polysilicon.

Third Embodiment

Figure 12:
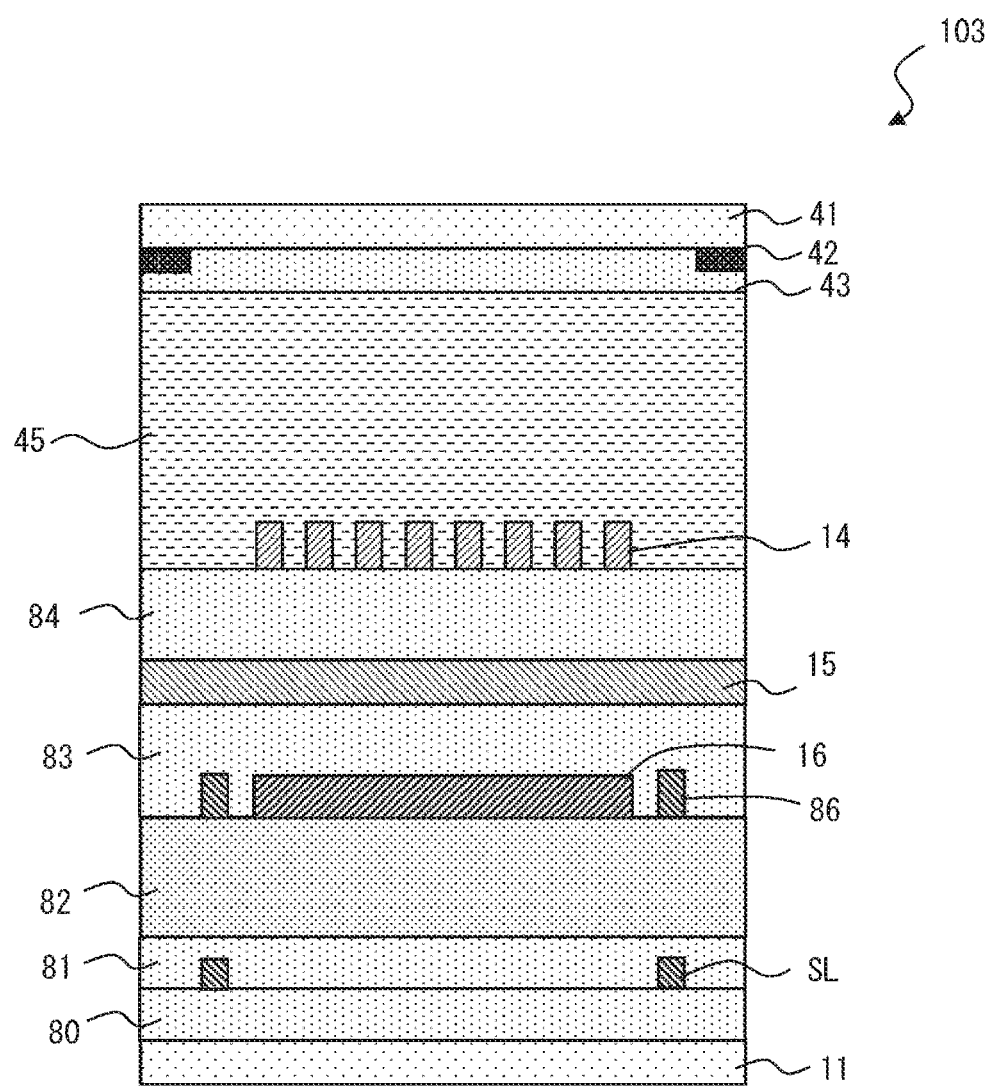
FIG. 12 is a schematic cross-sectional view of a liquid crystal display apparatus according to a third embodiment.

A liquid crystal display apparatus according to the present disclosure can be suitably assembled with a touch panel. FIG. 12 is a schematic cross-sectional view of a liquid crystal display apparatus 103 according to the present embodiment. Like the liquid crystal display apparatus 101 according to the first embodiment, in the liquid crystal display apparatus 103, the first gate bus lines GL1 and the second gate bus lines GL2 (neither are illustrated) are located on the first substrate 11. A gate insulating layer 80 is located on the first substrate 11 so as to cover the first gate bus lines GL1 and the second gate bus lines GL2.

The source bus lines SL, the semiconductor layers 18C to 18E, and the like (not illustrated) are located on the gate insulating layer 80. A first insulating layer 81 is located on the gate insulating layer 80 so as to cover the source bus lines SL, the semiconductor layers 18C to 18E, and the like.

The second insulating layer 82 is located on the first insulating layer 81, and wiring 86 including a detection electrode of the touch panel and the like are disposed on the second insulating layer 82. The auxiliary electrode 16 can also be disposed on the second insulating layer 82. A third insulating layer 83 is located on the second insulating layer 82 so as to cover the wiring 86 of the touch panel including the detection electrode and the auxiliary electrode 16. The common electrode 15 is located on the third insulating layer 83. A fourth insulating layer 84 is located on the common electrode 15, and the pixel electrode 14 is located on the fourth insulating layer 84. The gate insulating layer 80, the first insulating layer 81, the third insulating layer 83, and the fourth insulating layer 84 can be made of an inorganic insulating material, such as silicon oxide or silicon nitride, and the second insulating layer 82 can be made of an organic material, such as resin.

The structure of the liquid crystal display apparatus 103 other than described above is the same as that of the liquid crystal display apparatus according to the first or second embodiment.

According to the liquid crystal display apparatus 103, like the first or second embodiment, flicker can be reduced even when the liquid crystal display apparatus 103 is driven at low frequency. In addition, since the auxiliary electrode 16 can be disposed in the same layer as the wiring 86 of the touch panel, a large increase in the manufacturing process can be reduced even when a full-in-cell panel display is configured.

Other Embodiments

A variety of modifications can be made to the liquid crystal display apparatus of the present disclosure. The first to third embodiments can be combined as appropriate. In addition, for example, the position and configuration of the auxiliary electrode 16 are not limited to those in the above embodiments. While the liquid crystal display apparatuses according to the first to third embodiments are widely used transmissive liquid crystal display apparatuses, the liquid crystal display apparatuses according to the present disclosure may be reflective liquid crystal display apparatuses. In this case, in the liquid crystal display apparatus 101 according to the first embodiment, the auxiliary electrode 16 can be made of a metal. In this case, the auxiliary electrode 16, the first gate bus line GL1, and the second gate bus line GL2 may be made of the same metallic material in the same manufacturing process. This enables the manufacturing process to be simplified. At this time, if the auxiliary electrode 16 is made of a metal with high reflectance, such as silver (Ag) or aluminum (Al), and the auxiliary electrode 16 is used as a reflecting electrode, the pixel electrode 14 and the common electrode 15 can be made of a transparent conductive material, as in the first to third embodiments. In addition, the pixel electrode 14 may be used as a reflecting electrode by configuring at least a portion of the pixel electrode 14 with a metal of high reflectivity.

The auxiliary electrode 16 may be disposed at a location that does not overlap the pixel electrode 14 in plan view. For example, the auxiliary electrode 16 may be disposed at a location that overlaps the black matrix 42 in plan view. In this case, the auxiliary electrode 16 may be formed at the same time as the pixel electrode 14, using the same material, for example.

As described above, the liquid crystal display apparatus according to the present disclosure uses the interlaced technique when driven at a low refresh rate. The liquid crystal display apparatus according to the present disclosure may support two or more refresh rates. For example, the liquid crystal display apparatus may also support a high refresh rate in order to display images with a high frame rate. In this case, the liquid crystal display apparatus may employ the interlaced technique only when driven at a low refresh rate and may be driven using the progressive technique when driven at a high refresh rate. However, the liquid crystal display apparatus may be driven using the interlaced technique even when operated at a high refresh rate.

The liquid crystal display apparatus according to the present disclosure can also be described as follows. A liquid crystal display apparatus according to a first configuration includes a TFT substrate and a liquid crystal layer. The TFT substrate includes a first substrate, a plurality of gate bus lines disposed on the first substrate, where the plurality of gate bus lines each extend in a first direction and are arranged in a second direction that crosses the first direction, a plurality of source bus lines disposed on the first substrate and each extending in the second direction, and a plurality of pixels disposed on the first substrate. Each of the pixels includes a pixel electrode disposed between, among the plurality of gate bus lines, a first gate bus line and a second gate bus line adjacent to each other and located facing the liquid crystal layer, a common electrode located between the first substrate and the pixel electrode so as to overlap the pixel electrode in plan view, an auxiliary electrode, a first TFT having a gate connected to one of the first gate bus line and the second gate bus line and a drain connected to the pixel electrode, a second TFT having a gate connected to the one of the first gate bus line and the second gate bus line and a drain connected to the auxiliary electrode, and a third TFT having a gate connected to the other of the first gate bus line and the second gate bus line, a source connected to one of the pixel electrode and the auxiliary electrode, and a drain connected to the other of the pixel electrode and the auxiliary electrode. Gate signals are applied to the first gate bus line and the second gate bus line so that the TFTs connected to the first gate bus line and the second gate bus line are turned on at different points in time.

According to the first configuration, since the pixel electrode and the auxiliary electrode are connected at a point in time different from a point in time at which the pixel electrode and the auxiliary electrode are charged, the charge stored in the auxiliary electrode in the middle of the image display period can be transferred to the pixel electrode. Therefore, even when the refresh rate is reduced and, thus, the interval between image refresh times is increased, the charge leaked from the liquid crystal layer in each pixel can be compensated for by the charge stored in the auxiliary electrode during the period until the next image refresh time. As a result, the voltage drop of the pixel electrode can be reduced, and flicker can be reduced.

According to a second configuration, in the first configuration, a source of each of the first TFT and the second TFT may be connected to one of the plurality of source bus lines. Since the first and second TFTs are connected in parallel to the source bus line, the pixel electrode and the auxiliary electrode can be charged at the same voltage.

According to a third configuration, in the first configuration, a source of the first TFT may be connected to one of the plurality of source bus lines, and a source of the second TFT may be connected to the drain of the first TFT. Since the potential difference between the source and the drain decreases when the second TFT is turned off, the charge stored in the auxiliary electrode is less likely to leak.

According to a fourth configuration, in any one of the first to third configurations, each of the pixel electrode, the common electrode, and the auxiliary electrode may be made of a transparent conductive material.

According to a fifth configuration, in any one of the first to third configurations, the auxiliary electrode, the first gate bus line, and the second gate bus line may be made of the same metallic material.

According to a sixth configuration, in the fifth configuration, the pixel electrode may be made of a metallic material.

According to a seventh configuration, in any one of the first to sixth configurations, the pixel electrode may have a plurality of slit-like openings.

According to an eighth configuration, in any one of the first to seventh configurations, the transistor characteristics of the first TFT and the second TFT may be the same.

According to a ninth configuration, in any one of the first to eighth configurations, the capacitance formed by the common electrode and the pixel electrode may be the same as the capacitance formed by the common electrode and the auxiliary electrode. According to a tenth configuration, in any one of the first to ninth configurations, the auxiliary electrode may be disposed at a location that does not substantially contribute to displaying.

According to an eleventh configuration, in any one of the first to tenth configurations, the auxiliary electrode may be located between the common electrode and the first substrate so as to overlap the pixel electrode in plan view.

According to a twelfth configuration, the liquid crystal display apparatus according to the eleventh configuration may further include a counter substrate including a second substrate and a black matrix disposed on the second substrate, where the black matrix has an opening. The liquid crystal layer may be located between the counter substrate and the TFT substrate, and the opening of the black matrix may overlap at least part of the pixel electrode in plan view. The auxiliary electrode may overlap the black matrix in plan view.

According to a thirteenth configuration, in any one of the first to twelfth configurations, the plurality of pixels may be two-dimensionally arranged in the first direction and the second direction, and the first TFTs of the plurality of pixels arranged in the second direction may be alternately connected to one of the first gate bus lines and one of the second gate bus lines.

According to a fourteenth configuration, the liquid crystal display apparatus according to the thirteenth configuration may further include a gate driver disposed on the TFT substrate and configured to apply gate signals to the plurality of gate bus lines. The gate driver may drive the plurality of gate bus lines using an interlaced technique.

The liquid crystal display apparatuses according to the present disclosure can be suitably used as liquid crystal display apparatuses used in a variety of fields and are particularly suitable as liquid crystal display apparatuses used for applications where low power consumption is of great concern.

The present disclosure contains subject matter related to that disclosed in Japanese Priority Patent Application JP 2022-182624 filed in the Japan Patent Office on Nov. 15, 2022, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A liquid crystal display apparatus comprising:
   a thin film transistor (TFT) substrate including:
   a first substrate;
   a plurality of gate bus lines disposed on the first substrate, each of the plurality of gate bus lines extending in a first direction and arranged in a second direction that crosses the first direction;
   a plurality of source bus lines, each disposed on the first substrate and extending in the second direction; and
   a plurality of pixels disposed on the first substrate; and
   a liquid crystal layer,
   wherein each of the plurality of pixels includes:
   only one pixel electrode disposed between, among the plurality of gate bus lines, a first gate bus line and a second gate bus line adjacent to each other and located facing the liquid crystal layer,
   a common electrode located between the first substrate and the only one pixel electrode so as to overlap the only one pixel electrode in a plan view,
   an auxiliary electrode,
   a first TFT having a gate connected to one of the first gate bus line and the second gate bus line and a drain connected to the only one pixel electrode,
   a second TFT having a gate connected to the one of the first gate bus line and the second gate bus line and a drain connected to the auxiliary electrode, and
   a third TFT having a gate connected to the other one of the first gate bus line and the second gate bus line, a source connected to one of the only one pixel electrode and the auxiliary electrode, and a drain connected to the other one of the only one pixel electrode and the auxiliary electrode, and
   wherein gate signals are applied to the first gate bus line and the second gate bus line so that the first, second, and third TFTs connected to the first gate bus line and the second gate bus line are turned on at different points in time, and
   the only one pixel electrode and the auxiliary electrode are connected at a different timing from a timing when the only one pixel electrode and the auxiliary electrode are charged so as to transfer charge stored by the auxiliary electrode to the only one pixel electrode.

2. The liquid crystal display apparatus according to claim 1, wherein a source of each of the first TFT and the second TFT is connected to one of the plurality of source bus lines.

3. The liquid crystal display apparatus according to claim 1, wherein a source of the first TFT is connected to one of the plurality of source bus lines, and a source of the second TFT is connected to a drain of the first TFT.

4. The liquid crystal display apparatus according to claim 1, wherein each of the only one pixel electrode, the common electrode, and the auxiliary electrode is made of a transparent conductive material.

5. The liquid crystal display apparatus according to claim 1, wherein, in each pixel of the plurality of pixels, the auxiliary electrode, the first gate bus line, and the second gate bus line are made of the same metallic material.

6. The liquid crystal display apparatus according to claim 5, wherein the only one pixel electrode is made of a metallic material.

7. The liquid crystal display apparatus according to claim 1, wherein the only one pixel electrode has a plurality of slit-like openings.

8. The liquid crystal display apparatus according to claim 1, wherein transistor characteristics of the first TFT and the second TFT are the same.

9. The liquid crystal display apparatus according to claim 1, wherein a capacitance formed by the common electrode and the only one pixel electrode is the same as a capacitance formed by the common electrode and the auxiliary electrode.

10. The liquid crystal display apparatus according to claim 1, wherein the auxiliary electrode is disposed at a location that does not substantially contribute to displaying.

11. The liquid crystal display apparatus according to claim 1, wherein the auxiliary electrode is located between the common electrode and the first substrate so as to overlap the only one pixel electrode in the plan view.

12. The liquid crystal display apparatus according to claim 1, further comprising:
   a counter substrate including a second substrate and a black matrix disposed on the second substrate, wherein the black matrix has an opening,
   the liquid crystal layer is located between the counter substrate and the TFT substrate, and the opening of the black matrix overlaps at least part of the only one pixel electrode in the plan view, and
   the auxiliary electrode overlaps the black matrix in the plan view.

13. The liquid crystal display apparatus according to claim 1, wherein the plurality of pixels is two-dimensionally arranged in the first direction and the second direction, and
   wherein in each of the plurality of pixels, the first TFT arranged in the second direction is alternately connected to one of the first gate bus line and one of the second gate bus line.

14. The liquid crystal display apparatus according to claim 13, further comprising:
   a gate driver disposed on the TFT substrate and configured to apply the gate signals to the plurality of gate bus lines,
   wherein the gate driver drives the plurality of gate bus lines using an interlaced technique.

15. The liquid crystal display apparatus according to claim 1, wherein the auxiliary electrode is formed in a different layer than the only one pixel electrode via an insulating layer.

* * * * *